United States Patent [19]

Plante

[11] Patent Number: 4,912,400
[45] Date of Patent: Mar. 27, 1990

[54] APPARATUS FOR TESTING CIRCUIT BOARDS

[75] Inventor: James E. Plante, Rehobeth, Mass.

[73] Assignee: Design and Manufacturing Specialties, Inc., Attleboro, Mass.

[21] Appl. No.: 243,617

[22] Filed: Sep. 13, 1988

[51] Int. Cl.⁴ .......................... G01R 1/04; H01R 9/09
[52] U.S. Cl. ................................. 324/158 F; 439/42
[58] Field of Search ........... 324/158 F, 158 P, 73 PC, 324/73 AT; 439/42

[56] References Cited

U.S. PATENT DOCUMENTS

| | | | |
|---|---|---|---|
| 3,970,934 | 7/1976 | Aksu | 324/158 F |
| 4,746,861 | 5/1988 | Nesbitt | 324/158 P |
| 4,780,086 | 10/1988 | Jenner et al. | 324/158 F |
| 4,818,933 | 4/1989 | Kerschner et al. | 324/158 F |
| 4,829,241 | 5/1989 | Maelzer | 324/158 F |
| 4,841,241 | 6/1989 | Hilz et al. | 324/158 F |

FOREIGN PATENT DOCUMENTS 256368 2/1988 European Pat. Off. ........ 324/158 F

Primary Examiner—Reinhard J. Eisenzopf
Assistant Examiner—Vinh P. Nguyen
Attorney, Agent, or Firm—Schiller, Pandiscio & Kusmer

[57] ABSTRACT

A test fixture for use in systems designed to test circuit boards. The test fixture is adapted to receive pre-wired interchangeable modules which contain a plurality of fixed test probes disposed in an array mirroring the location of test points on the specific circuit board to be tested. The interchangeable modules have standardized arrays of intermediate connectors for mating with mirrored arrays of connectors on the frame of the test fixture.

13 Claims, 4 Drawing Sheets

APPARATUS FOR TESTING CIRCUIT BOARDS

This invention relates to apparatus for testing circuit boards, and more particularly, to test fixtures for use in systems for testing circuit boards.

The term "circuits board" as used herein refers to electrical circuits and subcircuits mounted on printed circuit boards, and includes but is not limited to complex computer-based operating systems, component mounted printed circuit boards, and the like.

Test fixtures are most commonly used in the manufacturing of circuit boards as a quality control device, and function to electrically connect test points on a circuit board under test to an evaluation system such as a digital computer typified by a diagnostic microprocessor. The test system responds to the computer's evaluation by indicating visually, audibly or in any other conventional way that the circuit board either is functionally defective or not, as the case may be, and may also provide a qualitative analysis of deficiencies suffered by the board being tested.

Test fixtures typically comprise an array of test probes (sometimes called a "bed-of-nails"), the tips of the test probes being intended to contact selected test points on the circuit board. The individual test probes are mounted on a platform in alignment with a corresponding test point on the surface of a circuit board so that the array of test points is mirrored by the array of test probes. Each test probe is directly wired to a corresponding connector leading to the computer in the test system. Since it is not uncommon for thousands of such test probes to be required for a fixture used to test one type of circuit board, rewiring of a test fixture for testing a different type of circuit board is a major undertaking. Consequently, manufacturers who need to test many different types of boards typically own many different test fixtures, each with a bed-of-nails assembly dedicated to the configuration of a different circuit board.

The test probes used in the bed-of-nails assembly may be one of several different types known in the art. Spring-loaded test probes with retractable tips that may withdraw to compensate for irregularities in levels among contact test points have been found particularly useful. Typically about four to about eight ounces of pressure can be placed on each of the spring-loaded contact probes before the plunger is fully depressed.

The test probes are relatively expensive because they are preferably spring-loaded, must be very hard, corrosion resistant and typically have partially gold-plated tips. These features are desirable to assure that each probe will be durable and will provide low electrical contact resistance. In addition, these plunger-type test probes typically require a high degree of manufacturing precision to assure the proper electrical contact between (a) the contact tip and the test point and (b) the sliding plunger mechanism and the surrounding tube.

Efforts have been made to reduce the expense associated with designing and fabricating test fixtures with custom-wired platforms for each circuit board. Examples of such efforts are found in the following patents and the references cited therein.

U.S. Pat. No. 4,017,793 (issued to Haines) discloses a printed circuit board tester. The test fixture is a multiple unit device for testing any of a plurality of circuit board configurations. The fixture includes foam sheets that have a pattern cut out of their central portion. The configuration of the cut-out portion is determined by the printed circuit board to be tested. The foam sheets mask out all but the necessary testing units and also serve to assure minimum distortion of the board during testing.

U.S. Pat. No. 4,164,704 (issued to Kato et al) discloses a plural probe circuit card fixture using a vacuum collapsed membrane to hold the card against the probes. The test probes are stabilized against the vacuum force by mounting them in a rigid module for simultaneous insertion into the lower surface of a testing chamber.

U.S. Pat. No. 4,321,533 (issued to Matrone) discloses a printed circuit board test fixture having interchangeable card personalizers. The card personalizers are flat plates which act to mask selected test probes. The masks have holes drilled completely therethrough at selected locations corresponding to the locations of the selected probes which will contact test points on the associated printed circuit board. The mask prevents the remaining probes from making contact with the printed circuit board and thus allows a single test fixture to be used for a "family" of similar circuit boards.

U.S. Pat. No. 4,344,033 (issued to Stowers et al) discloses a vacuum-activated test fixture for printed circuit boards. The test fixture utilizes a yielding diaphragm assembly with rigid frame and spring-loaded diaphragm base plate for distributing downward atmospheric pressure evenly over the entire area of the circuit board without localized stress concentrations.

U.S. Pat. No. 4,357,062 (issued to Everett) discloses a universal circuit board test fixture. Each test fixture contains a set of interchangeable standardized removably mountable displacement modules for mounting on a back plate. The displacement modules have engagement pads which are configured in a pattern corresponding to the arrangement of the test points on the circuit boards to be tested. The engagement pads then cause selected double action test probes on a platform to extend so that the selected test probes will make contact with the printed circuit board during testing.

Accordingly, the principal object of the invention is to provide novel apparatus for establishing electrical connections to test points on a circuit board, which apparatus does not suffer from the drawbacks of the prior art.

A further object of the present invention is to provide novel apparatus that can be modified quickly and conveniently to establish electrical connection to tests points on any of a plurality of different circuit boards without the need for rewiring the test fixture for each new circuit board to be tested.

Still another object of the invention is to provide apparatus for establishing electrical connections to a circuit board without damaging the circuit board or the electronic components thereon.

Yet other objects of the present invention are to provide a test fixture that provides dual access, i.e. permits one to test both sides of a circuit board contemporaneously; to provide such a test fixture that is designed to mate with conventional automatic test equipment or can be configured as a standalone unit; to provide such a fixture that can be used with bare boards or with loaded boards with surface mounted devices of mixed technology; to provide such a fixture that is constructed so that none of the wiring is flexed during operation; and to provide such a fixture in which rapid changeover to test different types of boards is accomplished with easily removable, self-aligning test-heads and product carrier plates.

These and other objects of the present invention are achieved by an improvement in apparatus for establishing electrical connection to test points on a circuit board, which apparatus comprises a frame and means for mounting a circuit board under test in a fixed position relative to the frame, means including a first multiplicity of test probes being disposed in a first array determined by the location of the test points on at least a first surface of the circuit board under test. Seating means are provided for releasably moving the probes and test points into contact with one another to thereby establish said electrical connection.

The improvement provided by the present invention permits use of the apparatus with any of a number of different types of circuit boards and, in one embodiment, with both sides of such board. Such improvement comprises a removable probe module releasably mountable on the apparatus frame in a fixed location with respect to the fixed position of the circuit board under test, a multiplicity of test probes being mounted on the module in an array determined by the location of the test points on the circuit board, so as to face the surface of that board when the latter is in its fixed position. The module includes a first predetermined plurality of electrical connectors in a fixed standard array, and electrical conductor means electrically connecting each probe of the first multiplicity of test probes to a corresponding one of the first plurality of electrical connectors.

The apparatus further comprises a second plurality of connectors of like number as the first plurality of connectors, arranged in the same fixed standard array as the said first array, and disposed for releasably electrically contacting the first plurality of connectors.

The seating means of the present invention comprises means for moving said multiplicity of test probes and circuit board relative to one another so as to establish electrical contact between the test probes and the test points on the board, and contemporaneously for moving the first and second pluralities of electrical connectors relative to one another so as to establish electrical contact between such connectors.

Other objects of the present invention will in part be obvious and will in part appear hereinafter. The invention accordingly comprises the apparatus possessing the construction, combination of elements and arrangement of parts, all of which are exemplified in the following detailed disclosure and the scope of the application of which will be detailed in the claims.

For a fuller understanding of the nature and objects of the present invention, reference should be had to the following detailed description considered together with the accompanying drawing wherein.

Figure 1:
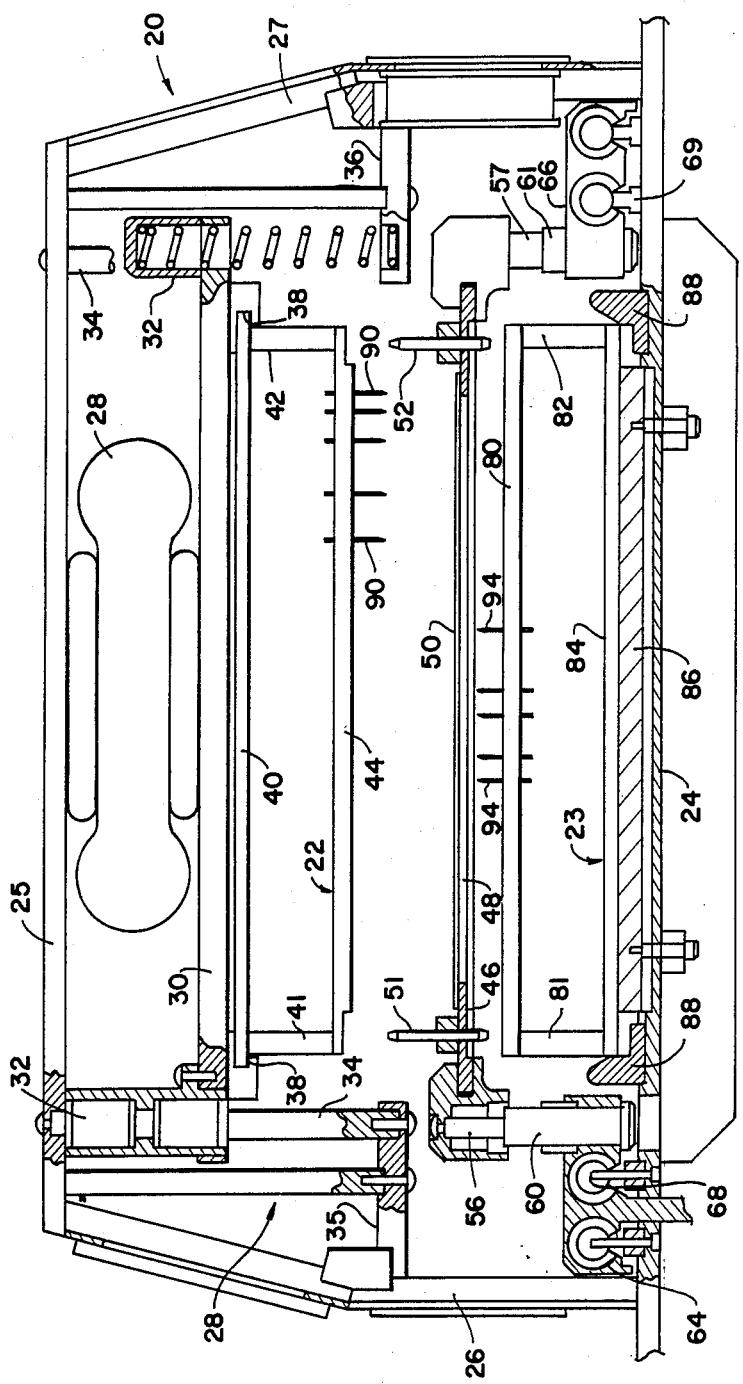
FIG. 1 is a side-elevational view, partly in cross section of a test fixture embodying the present invention, showing the carrier for the board under test in an extended position for loading or unloading.
Figure 2:
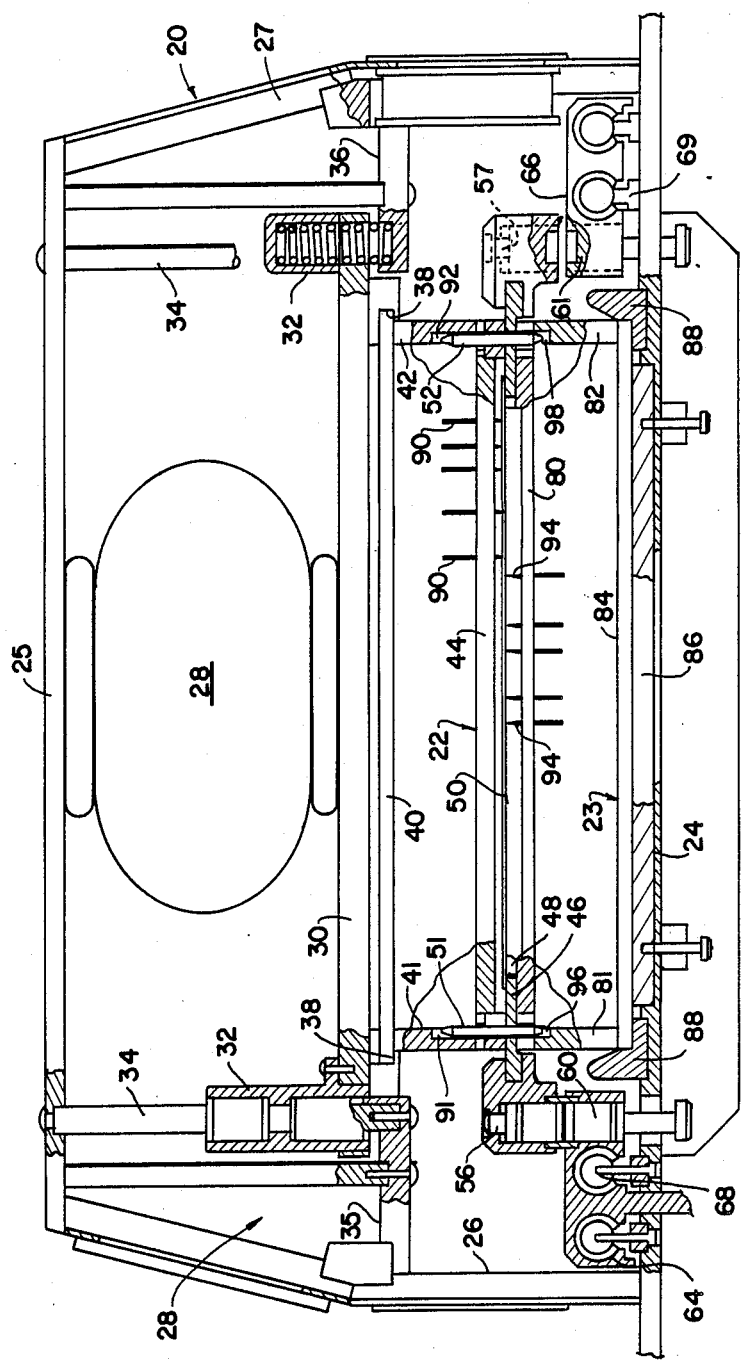
FIG. 2 shows the embodiment of FIG. 1 with the product carrier in its closed or operative position.
Figure 3:
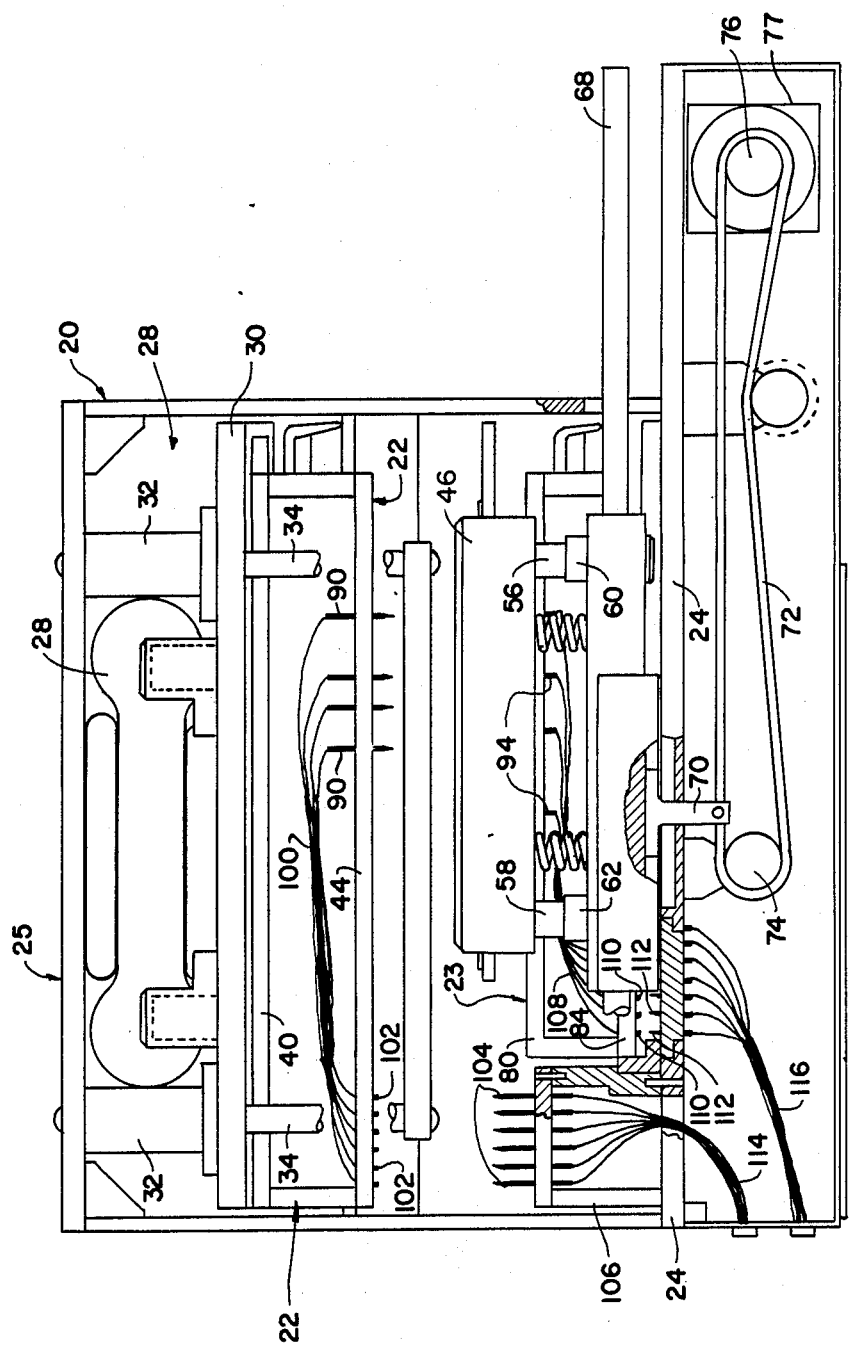
FIG. 3 is a front elevational view, partly in cross section, of the embodiment of FIG. 2, showing the probe modules of the fixture in their open position preparatory to testing or after testing.
Figure 4:
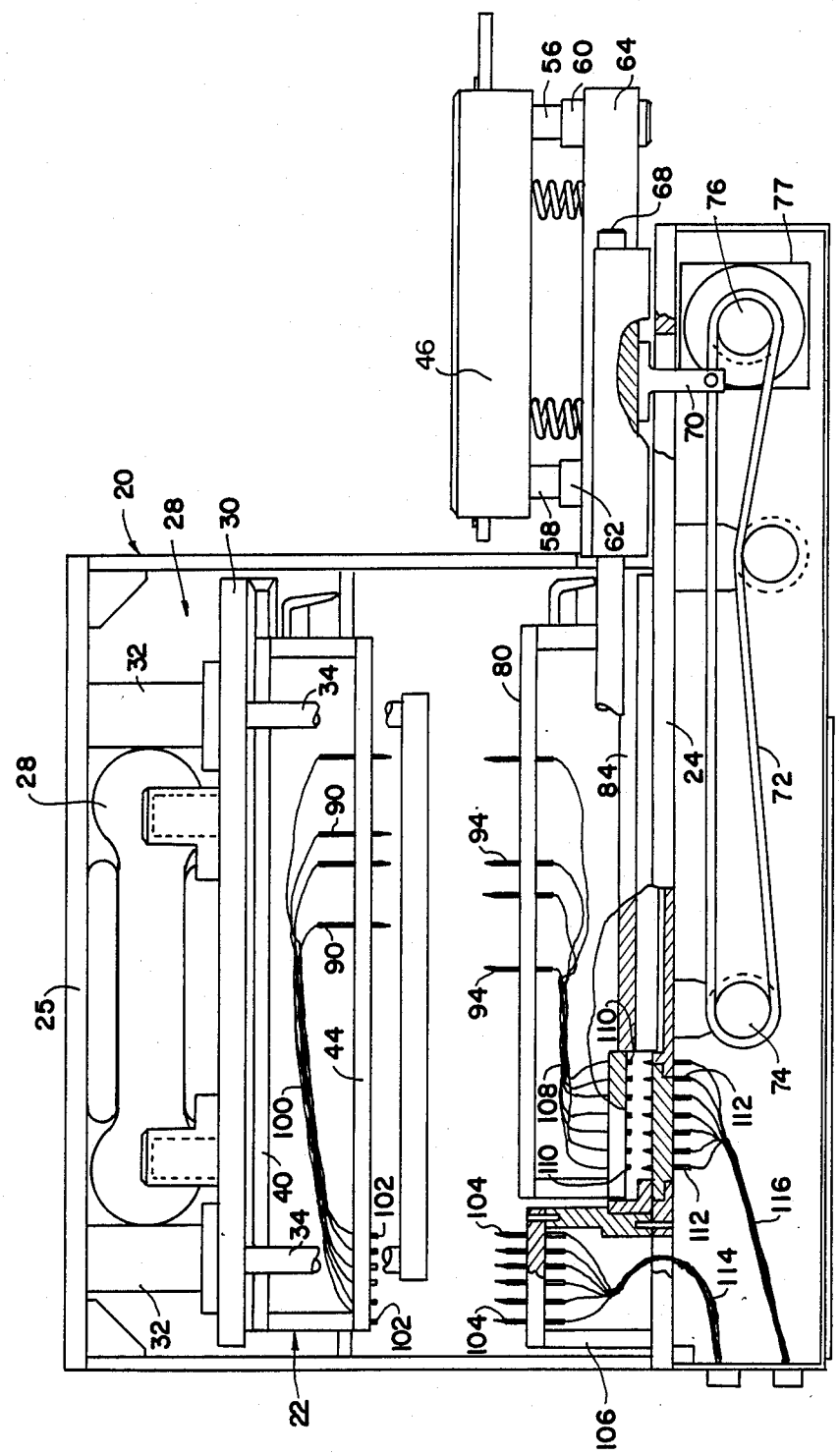
FIG. 4 shows the embodiment of FIG. 3 with the probe modules in their closed or test position with the probes in test contact with the board under test.

Referring now to the drawing, there is illustrated a test fixture of the present invention comprising frame assembly 20 with removable top or upper probe module 22 and removable bottom or lower probe module 23 mounted thereon. Frame assembly 20 is provided typically as a rectangular frame having bottom wall 24, top wall 25 and side walls 26 and 27 to form chamber 28 in which probe modules 22 and 23 are releasably mountable.

As seating means for applying pressure to a circuit board under test, the embodiment shown includes pneumatic bag 28 captured between top wall 25 and substantially planar, rigid pressure plate 30. Plate 30 is secured at its edges to a plurality of bushings 32 (preferably four, but only three being shown) mounted on a plurality of vertical guide posts 34 (only three being shown) for linear motion along the latter. Guide posts 33 and 34 are coupled between top plate 25 and respective support arms 35 and 36, each of the latter being connected to an intermediate position along the interior of corresponding side walls 26 and 27. Bushings 32 are spring loaded between plate 30 and top wall 25 so that plate 30 is resiliently biased toward top wall 25. Thus plate 30 is movable along a path constrained or defined by posts 34 from an upper position at which plate 30 is spaced from but is most closely adjacent top wall 25, to a lower or extended position at which the travel of plate 30 brings bushings 32 into adjacency with support arms 35 and 36.

As means for releasably mounting probe module 22 in normally spaced-apart relation to the circuit board under test, the bottom surface of pressure plate 30 is provided with a pair of horizontal channels or grooves 38 positioned respectively adjacent the side edges of plate 30 so as to support the upper wall of top probe module 22. Probe module 22 is shown in the form of a hollow box having an upper wall 40, side walls 41 and 42, and bottom wall 44, upper wall 40 being dimensioned to extend beyond the top edges of side walls 41 and 42 so as to form a pair of tongues so that in turn are dimensioned to fit slidingly but snugly into grooves 38 located on the underside of plate 30.

The embodiment of the invention shown in the drawing also includes substantially planar, board-support plate 46 for supporting boards to be tested. Plate 46 includes a centrally disposed aperture 48 therein, so that when a circuit board such as board 50 is disposed on plate 46, access is freely available to both sides of the board. Product support plate 46 is preferably provided with guide means, for example pins or the like pre-located in suitable locations corresponding to pre-located holes in circuit board 50, so that when the circuit board is properly mounted by engagement of such pins with the corresponding holes, the locations of the test points on the board will precisely correspond to or register with the locations of the test probes in the probe modules.

Mounted in fixed positions at the side edges of plate 46 are at least two guide pins 52 and 51 that extend perpendicularly both upwardly and downwardly from the plane of plate 46. Plate 46 is mounted adjacent the corners thereof on four spring-loaded plungers, only three of which, 56, 57 and 58, are shown. The plungers in turn are disposed for vertical sliding movement within four respective cylinders 60, 61 and 62, the last not being shown.

In order to permit plate 46 to be moved in its own plane from a first position wherein it is parallel to and directly faces pressure plate 30 (and therefore cannot be readily loaded with a circuit board) to an extended position in which it no longer faces plate 30 (and thus can readily be loaded with a circuit board), cylinders 60 and 62 are mounted upon glide 64, and similarly, cylinder 61 and the fourth cylinder are mounted upon glide 66. Glides 64 and 66 in turn are mounted for linear, parallel sliding motion on parallel rails 68 and 69 that are supported on bottom wall 24. At least one of glides 64 and 66 is connected through arm 70 to transmission belt 72. The latter constitutes an endless belt extending between idler wheel 74 and sheave 76 driven by reversible motor 77.

Bottom probe module 23 is shown in the form of a hollow box having an upper wall 80, side walls 81 and 82, and bottom wall 84, the module being dimensioned to fit between the undersurface of plate 46 and support plate 86. The latter is resiliently mounted on bottom wall 24. Frame 88 is also disposed on bottom wall 24 to surround plate 86 and provide a snug peripheral fit for module 23.

Mounted on and extending perpendicularly downwardly through bottom wall 44 of module 22 is an array of a plurality of elongated, electrically conductive test probes 90, all substantially parallel to one another. The tips of probes 90 lie preferably in a plane parallel to the plane of support plate 46. The side edges of module 22 are provided with respective bushings 91 and 92 disposed and dimensioned to register with the upwardly projecting portions of pins 51 and 52.

Mounted on and extending perpendicularly upwardly through top wall 80 of module 23 is another array of a plurality of elongated, electrically conductive test probes 94, all substantially parallel to one another. The tips of probes 94 also lie preferably in a plane parallel to the plane of plate 46. The side edges of module 23 are provided with respective bushings 96 and 98 disposed and dimensioned to register with the downwardly projecting portions of pins 51 and 52.

It will be appreciated that the number of probes extending from a particular probe module and the pattern in which such probes may be arranged, are dictated by the number and disposition of test points on the circuit board to be contacted by the probes. In this respect, it will also be appreciated that while probe module 22 is intended to provide a probe array for contacting the upper surface of a circuit board under test and probe module 23 is intended to provide probes for contacting test points on the underside of the same board, the pattern and number of the arrays of probes on the two module is not necessarily the same and probably in most instances will differ markedly. The plurality of test probes 90 is thus disposed in a fixed array determined by the location of the test points on the upper surface of the specific type of circuit board 50 under test, and similarly, the disposition in the array of probes 94 is determined by the location of the test points on the underneath surface of that particular type of circuit board 50.

Test probes 90 and 94 may be any of several different types known in the art. The probes are preferably of the spring-loaded type and should be very hard, corrosion resistant and have partially gold-plated tips. These features are desirable to assure that each probe will be durable and will provide low contact resistance. Spring-loaded test probes with retractable tips are preferred because the length is thus adjustable automatically to compensate for irregularities in levels among contact test points. It is not uncommon for thousand of such test probes to be required to test a circuit board. Typically about four to about eight ounces of pressure can be placed on each of the contact probes before the plunger is fully engaged.

Probes 90 and 94 are typically plugged into receptacles having wire wrap posts at their bases in the interior of respective probe modules. Each of probes 90 is directly connected by a corresponding conductor or wire 100 to a corresponding one of a predetermined fixed number of connection points 102 in the form of a plurality of electrical contacts such as rivet heads or the like disposed in a fixed standard array. The array of connection points mounted, for example in bottom wall 44 of module 22 adjacent one edge of the latter and are intended to interconnect releasably with a corresponding plurality of probes 104 mounted on pedestal 106 fixed to wall 24 at the bottom of chamber 28 in frame assembly 20. Probes 104 are the same in number as the number of connection points 102 and are in an array matched to or mirroring the array of connection points 104 so that every one of probes 104 can simultaneously contact a corresponding one of the connection points 102 in the fixed standard array. Of course, the number of connection points must at least equal and preferably exceed the number of test points on the circuit board under test, the excess number of connection points simply being unused or blanked in each case.

For example, assume that the number of probes 90 in two different modules 22 are respectively, as dictated by the nature of the corresponding types of circuit boards, 400 and 800. The number of connection points 102 in each standard array on each of the two different modules however is necessarily the same, and one can further assume that each such array would comprise 1024 such connection points for example in a rectangular 32×32 array. The replacement of one module 22 for the other would provide exactly the same number of connection points 102 although the number of probes 90 required in the probe module would differ markedly.

Similarly, each of probes 94 is directly connected by a corresponding conductor or wire 108 to a corresponding one of a predetermined fixed number of connection points 110 disposed in a fixed standard array in the form of a plurality of electrical contacts such as rivet heads or the like. The latter are mounted, for example in bottom wall 84 of module 23 adjacent one edge of the latter and are intended to interconnect releasably with a corresponding plurality of probes 112 mounted on bottom wall 24 of chamber 28 in frame assembly 20. Probes 112 are the same in number as the number of connection points 110 and are in an array matched to the array of connection points 110 so that every one of probes 112 can simultaneously contact a corresponding one of the connection points 110 in the fixed standard array.

It will be appreciated that the term "standard array" as used herein is intended to indicate that the number and physical location of connection points 102 and 110 and the corresponding array of probes 104 and 112 in a standard array with respect to each other are established according to the wishes of the manufacturer of the equipment and thus are arbitrary and remain unchanged regardless of which particular probe module is mounted in the frame assembly, whereas the number and location of the array of probes 90 and 94 of the probe modules are uniquely determined, not by the manufacturer of the equipment, but by the configuration of contact or test points on the specific type of circuit board to be tested. This identicality of connection point arrays permits the substitution of an unlimited number of probe modules in the system of the present invention, each for use in testing circuit boards having different configurations.

The standard arrays of probes 104 and 112 are designed and intended to provide means for connecting the probes in the probe modules through intermediate connectors to a diagnostic device such as a computer through output cables 114 and 116 respectively coupled to probes 104 and 112. The use of such intermediate connectors insures that the wiring between the probes and the connection points is not flexed or otherwise disturbed during operation of the system, and also permits one to use the system with a huge variety of probe arrays on different probe modules to test an equally large number of circuit board configurations.

To test any particular circuit board 50 in the test fixture of the invention, one need only select appropriate probe modules 22 and 23 which contain respective probe array configurations mirroring the test point configuration on the opposite sides for the specific type of circuit board 50 to be tested. The probe modules contain internally all the wiring needed to conductively connect each of the probes in the specific array patterns to the respective standardized arrays of connection points 102 and 110. The particular removable probe module 22 selected is then inserted into the frame assembly chamber so as to position module 22 within grooves 38. Similarly, module 23 is positioned within frame 28.

Motor 78 is energized to drive belt 72 so as to draw glides 64 and 66 along rails 68 and 69 to an extended position wherein support plate 46 is free of top probe module 22. Board 50 is then emplaced on plate 46 across aperture 48 so that the location of test points on board 50 will exactly correspond to the arrays of test probes 90 and 94. Motor 78 is then reversed to move plate 46 and associated board 50 to its proper position between the two probe modules. It will be appreciated that the operation of motor 78 and the loading of boards 50 on plate 46 can readily be automated or computer controlled. Board 50 can be a "loaded" board that supports electronic components interconnected and mounted thereon in the configuration intended for the ultimate use of the board. Of course, the invention is equally useful in testing unloaded or so called "bare" boards. The configuration of the components on the board is not critical to the practice of the present invention and the invention is not intended to be limited to a "family" or single type of test board having a particular number of test points arranged in a pattern similar to one another.

Air under a positive pressure above atmospheric is then introduced into bag 28 to expand the latter and apply pressure to plate 30. This serves to drive the latter and top probe module downwardly along posts 34 against the spring loading of bushings 32 and causing pins 50 and 52 to respectively engage bushings 91 and 92 to precisely align the top probe module with product support plate 46. The continued downward motion of module 22 brings the array of test points on the upper surface of board 50 into physical and electrical contact with the tips of the mirror-image array of spring-loaded test probes 90, contemporaneously also bringing contact points 102 into physical and electrical contact with the standard array of intermediate connecting probes 104. These two contacts thus establish and maintain a conductive connection between those test points on the upper surface of the board under test and the diagnostic computer.

Continued downward motion of the top probe module drives probes 90 into the test points on board 50 against the resilient bias provided by the spring loading in the array of probes 90, forcing product support plate 46 downwardly along plungers 56 against the spring-loading of cylinders 60. This downward motion of plate 46 forces the lower portions of pins 51 and 52 into bushings 96 and 98, thereby precisely aligning the bottom probe module with product support plate 46. Continued downward motion of plate 46 under the pressure exerted by the top probe module, brings the test points on the lower surface of board 50, exposed by aperture 48, into physical and electrical contact with the mirror array of probes 94 and also brings the standard array of connection points 110 into physical and electrical contact with intermediate connection probes 112. These two contacts thus establish and maintain an electrically conductive connection between those test points on the lower surface of the board under test and the diagnostic computer.

Release of air pressure from bag 28 permits the top and bottom probe modules to separate, under the biases imposed by the resilient mounting of plate 86, the spring-loadings in cylinders 60 and 61, and the spring-loading in bushing 32, from the board under test and breaks all electrical connections in the system between probes and connection points and probes and test points. Plate 46 can then be extended again by motor 78 and board 50 replace by a new board for testing.

The variety of circuit boards which may be tested in the test fixture of the invention is limited only to circuit boards having a number of test points equal to or less than the number of individual wires or leads coupled between the standard arrays of probes and the diagnostic computer.

Those skilled in the art will appreciate the advantages of the arrangement just described. By providing pre-wired modular units each having an array of test probes which corresponds to the array of test points in the type of circuit board being tested, which modular units are readily detachable from the test fixture, a wide variety of circuit board layouts can be quickly tested in a single test fixture without the need for rewiring the test fixture for each type of circuit board to be tested.

A cost savings over prior art circuit board test equipment will result from implementation of the present invention. This savings derives, in part, from a savings in the cost of materials which must be scrapped to adapt a new test fixture to a new circuit board. Additional savings are derived from reduction of down-time of the testing system, the lower capital outlay required for replaceable modules in lieu of complete new test fixtures, and smaller storage requirements for modules as compared to storage space for many test fixtures.

It is to be understood that other changes may be made without departing from the scope of the present invention. Thus for instance, the assembly of the present invention may be modified to accommodate only one releasable probe module, so that only one side of the board is tested at a time. It should be noted that the frame may be directly wired to a diagnostic computer, or can be connected to a broadcast unit if desired. The removable probe modules of the present invention should not be considered limited to a box form as described above, and indeed may assume a large number of other configurations.

It is also contemplated that the seating means may be any of the different types of means which have been used for engaging the contact test probes with different test points on a circuit board. These include: (a) vacuum fixtures, in which the circuit board is placed in a vacuum chamber which contains the array of test probes so that the circuit board can be forced under a vacuum against the array of test probes; (b) mechanical pressure fixtures, in which a mechanism is provided to engage an aligned circuit board to be tested against the array of test probes with sufficient force to establish and maintain a positive electrical contact; and (c) other pneumatic fixtures which are typically activated by pneumatic bellows which create a pressure differential and cause the circuit board to press against the array of probes.

The test fixture of the present invention is characterized by simplicity of construction, flexibility, ease of assembly and disassembly and overall convenience of use. It promotes precision high speed testing of a wide variety of circuit boards, regardless of the configurations of the components mounted thereon. Its many improvement features should now be apparent.

Even though the advantages have been set forth in the foregoing description, together with the details of the structure and function of the invention, it is to be understood that the disclosure is illustrative only. Various changes in shape, size and arrangement of parts may be resorted to without departing from the scope of the invention which is indicated by the board general meaning of the terms in which the appended claims are expressed.

What is claimed is:

1. In apparatus for establishing electrical connection to test points on a circuit board under test, said apparatus comprising a frame, means for normally positioning said circuit board under test in a first position relative to said frame, means for mounting a first probe module having a first plurality of test probes disposed thereon in a first array determined by the location of a plurality of said test points on a first surface of said circuit board under test, means for mounting a second probe module having a second plurality of test probes disposed thereon in a second array determined by the location of a plurality of said test points on the opposite surface of said circuit board under test, and seating means for releasably moving said probes and said test points into contact with one another to thereby establish said electrical connection, the improvement wherein:

said means for mounting said first probe module comprises a movable pressure plate mounted on said frame and having means for positioning said first probe module in a first predetermined location normally spaced apart from said first position with said first plurality of test probes facing said first surface when said circuit board is in said first position, and means for resiliently biasing said pressure plate into said spaced apart position;

said means for mounting said second probe module comprises means for resiliently and movably mounting said second probe module on said frame in a second predetermined location normally spaced apart from said first position with said second plurality of test probes facing said opposite surface of said circuit board when the latter is in said first position;

said means for positioning said circuit board comprises a product support plate for releasably mounting said circuit board in a predetermined position thereon;

said apparatus comprises first alignment means having respective mating portions thereof disposed on said first probe module and said product support plate; and second alignment means having respective mating portions thereof disposed on said second probe module and said product support plate; and wherein said seating means comprises means for moving said pressure plate, and said first probe module that may be mounted thereon, in a first direction under a predetermined pressure toward said first position of said circuit board against the bias of said means for resiliently biasing said pressure plate so as to, in sequence, (a) initially mate the portions of said first alignment means and align said first probe module and said circuit board, (b) move said first plurality of test probes in said first direction into electrical contact between said first plurality of test probes and said first plurality of test points, (c) mate the portions of said second alignment means so as to align said second probe module and said circuit board, and (d) exert pressure in said first direction on said circuit board to move said circuit board in said first direction and out of said first position to make electrical contact between said second plurality of test probes and said second plurality of test points against the resilient bias of said means for mounting said second probe module.

2. Apparatus according to claim 1 wherein said test probes are spring-loaded with retractable tips.

3. Apparatus according to claim 1 wherein said pressure plate is substantially planar and is disposed substantially parallel with said circuit board;

and said means for moving said pressure plate moves the latter substantially normal to the plane thereof in said first direction.

4. Apparatus according to claim 1 wherein said product support plate is substantially planar and said apparatus includes means for resiliently biasing said support plate into said first position, and means for moving said product support plate in a direction substantially normal to said first direction between said first position wherein said product support plate is substantially parallel to and faces said pressure plate and a second position wherein said product support plate remains substantially parallel to but no longer faces said pressure plate.

5. Apparatus according to claim 4 including motor means for driving said product support plate alternatively between said first and second positions.

6. Apparatus according to claim 4 wherein said product support plate is resiliently mounted so as to resiliently oppose pressure exerted by said pressure plate against said circuit board.

7. Apparatus according to claim 4 wherein said support plate is centrally apertured so as to permit access to opposite surfaces of said printed circuit board when the latter is mounted in said fixed position relative to said frame.

8. Apparatus according to claim 1 wherein said means for moving said pressure plate is pneumatically actuated.

9. Apparatus according to claim 1 wherein said product support plate has an aperture therein dimensioned to permit the test points on opposite surfaces of a circuit board mounted on said product support plate to be accessed by respective probes of said first and second plurality of probes.

10. Apparatus according to claim 1 wherein
said first module includes a first predetermined plurality of electrical connectors in a fixed first standard array, and electrical conductor means electrically connecting each said probe of said first plurality of test probes to a corresponding one of said first plurality of electrical connectors;
said second module includes a second predetermined plurality of electrical connectors arranged in a fixed second standard array and electrical conductor means electrically connecting each said probes of said second plurality of test probes to a corresponding one of said second plurality of electrical connectors;
said apparatus comprises a third plurality of connectors of like number as said first plurality of connectors, arranged in the same fixed standard array as said first standard array, and fixed to said frame for being releasably electrically contacted by said first plurality of connectors; and
said apparatus comprises a fourth plurality of connectors of like number as said second plurality of connectors, arranged in the same fixed standard array as said second standard array, and fixed to said frame for being releasably electrically contacted by said second plurality of connectors; and
said connectors, test probes and means for mounting said circuit board being so disposed and arranged that contemporaneously with contact between said first pluralities of test probes and test points, said first plurality of electrical connectors is moved in said first direction so as to establish electrical contact with said connectors of said third plurality of connectors, and contemporaneously with contact between said second pluralities of test probes and test points, said second plurality of electrical connectors is moved in said first direction so as to establish electrical contact with said connectors of said fourth plurality of connectors.

11. Apparatus according to claim 10 wherein one of said first and third pluralities of connectors comprises an array of spring-loaded probes and the other of said first and third pluralities of connectors is an array of electrical connection points that is a mirror image of said array of spring loaded probes.

12. Apparatus according to claim 10 wherein one of said second and fourth pluralities of connectors comprises an array of spring-loaded probes and the other of said second and fourth pluralities of connectors is an array of electrical connection points that is a mirror image of said array of spring loaded probes.

13. Apparatus according to claim 1 wherein said means for mounting said probe modules each comprise means for releasably mounting a respective said module.

* * * * *

UNITED STATES PATENT AND TRADEMARK OFFICE
CERTIFICATE OF CORRECTION

Page 1 of 2

PATENT NO. : 4,912,400
DATED     : March 27, 1990
INVENTOR(S) : James E. Plante

It is certified that error appears in the above-identified patent and that said Letters Patent is hereby corrected as shown below:

Column 3, line 56, delete "1" and substitute therefor -- 4 --;

Column 3, line 60, delete "2" and substitute therefor -- 3 --;

Column 3, line 60, delete "1" and substitute therefor -- 4 --;

Column 3, line 62, delete "3" and substitute therefor -- 1 --;

Column 3, line 63, delete "2" and substitute therefor -- 3 --;

UNITED STATES PATENT AND TRADEMARK OFFICE
CERTIFICATE OF CORRECTION

PATENT NO. : 4,912,400
DATED : March 27, 1990
INVENTOR(S) : James E. Plante

It is certified that error appears in the above-identified patent and that said Letters Patent is hereby corrected as shown below:

Column 3, line 66, delete "4" and substitute therefor -- 2 --; and

Column 3, line 66, delete "3" and substitute therefor -- 1 --.

Signed and Sealed this

Thirteenth Day of August, 1991

Attest:

HARRY F. MANBECK, JR.

*Attesting Officer*  *Commissioner of Patents and Trademarks*